(12) United States Patent
Xiao

(10) Patent No.: US 10,916,544 B2
(45) Date of Patent: Feb. 9, 2021

(54) GATE-ALL-AROUND QUANTUM WELL COMPLEMENTARY INVERTER AND METHOD OF MAKING THE SAME

(71) Applicant: SiEn (QingDao) Integrated Circuits Co., Ltd, Shangdong (CN)

(72) Inventor: Deyuan Xiao, Shanghai (CN)

(73) Assignee: SiEn (QingDao) Integrated Circuits Co., Ltd, Qingdao (CN)

(*) Notice: Subject to any disclaimer, the term of this patent is extended or adjusted under 35 U.S.C. 154(b) by 0 days.

(21) Appl. No.: 16/556,060

(22) Filed: Aug. 29, 2019

(65) Prior Publication Data

US 2020/0105762 A1 Apr. 2, 2020

(30) Foreign Application Priority Data

Sep. 28, 2018 (CN) .......................... 2018 1 1134878

(51) Int. Cl.
*H01L 27/092* (2006.01)
*H01L 21/8238* (2006.01)
(Continued)

(52) U.S. Cl.
CPC .... *H01L 27/0922* (2013.01); *H01L 21/30604* (2013.01); *H01L 21/324* (2013.01);
(Continued)

(58) Field of Classification Search
CPC ............. H01L 27/0922; H01L 27/0924; H01L 21/823807; H01L 21/823821;
(Continued)

(56) References Cited

U.S. PATENT DOCUMENTS 10,263,100 B1 * 4/2019 Bi ......................... B82Y 10/00
10,304,833 B1 * 5/2019 Suvarna ............... H01L 27/1211
(Continued)

*Primary Examiner* — Errol V Fernandes
*Assistant Examiner* — Jeremy J Joy
(74) *Attorney, Agent, or Firm* — Chen Yoshimura LLP

(57) ABSTRACT

The present invention provides a Gate-All-Around nano-sheet complementary inverter, comprising: P-type semiconductor transistors and N-type semiconductor transistors, wherein the P-type semiconductor transistors comprise P-type semiconductor nano-sheet channels, a first gate dielectric layer fully surrounding the P-type semiconductor nano-sheet channels, a first gate electrode layer fully surrounding the first gate dielectric layer, a first source region and a first drain region, connected to two ends of the P-type semiconductor nano-sheet channel respectively, the N-type semiconductor transistors comprise N-type semiconductor nano-sheet channels, a second gate dielectric layer fully surrounding the N-type semiconductor nano-sheet channels, a second gate electrode layer fully surrounding the second gate dielectric layer, a second source region and a second drain region, connected to two ends of the N-type semiconductor nano-sheet channel respectively; and a common electrode fully surrounding the first gate electrode layer and the second gate electrode layer; wherein the P-type semiconductor nano-sheet channels and the N-type semiconductor nano-sheet channels are laterally aligned, and the width of the P-type semiconductor nano-sheet channel is greater than that of the N-type semiconductor nano-sheet channel The structure of the disclosed device is compact enough to increase the density and improve the performance and simple enough to produce.

16 Claims, 10 Drawing Sheets

(51) Int. Cl.
| | |
|---|---|
| *H01L 29/10* | (2006.01) |
| *H01L 29/423* | (2006.01) |
| *H01L 29/78* | (2006.01) |
| *H01L 21/762* | (2006.01) |
| *H01L 21/306* | (2006.01) |
| *H01L 21/324* | (2006.01) |
| *H01L 21/8234* | (2006.01) |

(52) U.S. Cl.
CPC .... *H01L 21/76224* (2013.01); *H01L 21/8238* (2013.01); *H01L 21/823412* (2013.01); *H01L 21/823814* (2013.01); *H01L 27/0924* (2013.01); *H01L 29/1033* (2013.01); *H01L 29/42392* (2013.01); *H01L 29/7848* (2013.01)

(58) Field of Classification Search
CPC ........... H01L 29/42392; H01L 29/7842; H01L 29/7854; H01L 29/7786; H01L 29/7782; H01L 29/66431; H01L 29/66439; H01L 29/0673; H01L 29/125

See application file for complete search history.

(56) References Cited

U.S. PATENT DOCUMENTS

| | | | | |
|---|---|---|---|---|
| 2008/0237577 | A1* | 10/2008 | Chui | H01L 29/7842 257/24 |
| 2009/0090934 | A1* | 4/2009 | Tezuka | H01L 29/78696 257/190 |
| 2011/0018065 | A1* | 1/2011 | Curatola | H01L 29/0665 257/368 |
| 2011/0254102 | A1* | 10/2011 | Xiao | H01L 21/845 257/369 |
| 2014/0197377 | A1* | 7/2014 | Kim | H01L 27/1211 257/29 |
| 2015/0035071 | A1* | 2/2015 | Ching | H01L 27/092 257/369 |
| 2015/0311286 | A1* | 10/2015 | Lee | H01L 21/02532 257/351 |
| 2017/0104061 | A1* | 4/2017 | Peng | H01L 21/845 |
| 2017/0170331 | A1* | 6/2017 | Liang | H01L 29/7848 |
| 2017/0179248 | A1* | 6/2017 | Pawlak | H01L 29/775 |
| 2017/0194330 | A1* | 7/2017 | Lee | H01L 29/41775 |
| 2017/0358500 | A1* | 12/2017 | Lin | H01L 29/66795 |
| 2018/0069006 | A1* | 3/2018 | Kim | H01L 29/42392 |
| 2018/0151452 | A1* | 5/2018 | Doornbos | H01L 29/66469 |
| 2019/0088798 | A1* | 3/2019 | Kim | H01L 29/42392 |
| 2019/0371903 | A1* | 12/2019 | Bao | H01L 21/823828 |
| 2019/0393304 | A1* | 12/2019 | Guillorn | B82Y 10/00 |
| 2020/0043926 | A1* | 2/2020 | Ohtou | H01L 21/823828 |
| 2020/0105617 | A1* | 4/2020 | Wang | H01L 27/0924 |

* cited by examiner

GATE-ALL-AROUND QUANTUM WELL COMPLEMENTARY INVERTER AND METHOD OF MAKING THE SAME

FIELD OF THE INVENTION

The present invention generally relates to a semiconductor device. Specifically, the device of gate-all-around (GAA) nano-sheet complementary inverter and method of making the same are disclosed.

BACKGROUND OF THE INVENTION

FinFET is a kind of field effect transistor (FET) with vertical fin-like structure. The 3D fin-like structure may form three gates to promote the power and efficiency. Current 14 nm and 10 nm chips and even the developing 7 nm chips which are just in test run phase are applied such FinFET chips for power supply. Recently, the FinFET chips are applied in servers, computers and systems, and they will be dominant in the future couple years.

The US Patent Publication No. US08350298B2, entitled "HYBRID MATERIAL INVERSION MODE GAA CMOS-FET," disclosed a GAA CMOS FET with mixed material. The cross section shape of the PMOS and NMOS channels in such transistor is like a track of a stadium, and the gate fully surrounds the surface of the PMOS or NMOS channels. Such GAA transistors show higher carrier mobility and prevent from poly depletion effect and short channel effect.

The GAA transistor of 5 nm node may be formed by horizontally stacking silicon nano-sheets to promote required power and performance for future application. The forth "gate" is opened by the vertical structure changed to the horizontal silicon layers. Then, electrical signals may be transmitted between transistors by passing across other transistors on the chip. This means the signals pass a switch which width is not wider than the width of two to three DNA chains. Therefore, such characteristic may be used for development of a solution to devices served as nodes greater than 5 nm.

In 2017 Symposia on VLSI Technology & Circuits, held in Kyoto, a novel transistor chip served as 5 nm node was made public. The best process was applied to stacking silicon nano-sheets of the transistor. The gate surrounding the transistor may carry out about 300 billion switches in a chip which size is about a nail. Therefore, such chip shows significant improvement on power and performance.

However, how to further increase density of device, power and performance in the practical manufacture process is the problem to be solved for technical researchers.

SUMMARY OF THE INVENTION

In light of current technology, one aspect of the present invention is to provide a device of gate-all-around (GAA) nano-sheet complementary inverter and method of making the same with performance improvement.

To carry out one of above-mentioned or other object, an embodiment of the invention is to provide a Gate-All-Around nano-sheet complementary inverter, comprising: a substrate, P-type semiconductor transistors and N-type semiconductor transistors on the substrate, wherein the P-type semiconductor transistors comprise P-type semiconductor nano-sheet channels, a first gate dielectric layer fully surrounding the P-type semiconductor nano-sheet channels, a first gate electrode layer fully surrounding the first gate dielectric layer, a first source region and a first drain region, connected to two ends of the P-type semiconductor nano-sheet channel respectively, the N-type semiconductor transistors comprise N-type semiconductor nano-sheet channels, a second gate dielectric layer fully surrounding the N-type semiconductor nano-sheet channels, a second gate electrode layer fully surrounding the second gate dielectric layer, a second source region and a second drain region, connected to two ends of the N-type semiconductor nano-sheet channel respectively; a common electrode connecting the first gate electrode layer and the second gate electrode layer, and the common electrode fully surrounding the first gate electrode layer and the second gate electrode layer; wherein the P-type semiconductor nano-sheet channels and the N-type semiconductor nano-sheet channels are laterally aligned, and with a width, and a length along a horizontal direction, and a height along a vertical direction, the length of the P-type semiconductor nano-sheet channels define a distance between the first source region and the first drain region, the length of the N-type semiconductor nano-sheet channels define a distance between the second source region and the second drain region, the width of the P-type semiconductor nano-sheet channel is greater than that of the N-type semiconductor nano-sheet channel.

In accordance with some embodiments, the first drain and the second drain regions connect together as output, the second source connects to the ground, and the common electrode used as an input.

In accordance with some embodiments, a cross-sectional shape along the width direction of the P-type semiconductor nano-sheet channel and the N-type semiconductor nano-sheet channel are a racetrack shape, the racetrack shape is formed by half circles of left hand side and right hand side and connected with a rectangle in the middle.

In accordance with some embodiments, the P-type semiconductor nano-sheet channel is silicon nano-sheet and the N-type semiconductor nano-sheet channel is silicon nano-sheet.

In accordance with some embodiments, the P-type semiconductor transistors comprise a plurality of P-type semiconductor nano-sheet channels along the longitude direction, and the N-type semiconductor transistors comprise a plurality of N-type semiconductor nano-sheet channels along the longitude direction.

In accordance with some embodiments, the material of the first source region and the first drain region comprise P-type SiGe, the material of the second source region and the second drain region comprise N-type SiC.

In accordance with some embodiments, a dielectric layer is formed between the first source region/the first drain region and the first gate electrode layer/common electrode, and a dielectric layer is also formed between the second source region/the second drain region and the second gate electrode layer/common electrode.

In accordance with some embodiments, an insulation barrier layer formed below the P-type semiconductor transistors and the N-type semiconductor transistors to isolate the substrate.

To carry out one of above-mentioned or other object, an embodiment of the invention is to provide a method of making a Gate-All-Around nano-sheet complementary inverter, comprising steps of:of: providing a substrate, alternatively forming sacrificial layer and semiconductor nano-sheet layer on the substrate to form stack structures; deforming at least two channel regions with different widths, and etching stack structures to obtain at least two semiconductor nano-sheets with different widths, correspond to at least two channel regions with different widths, removing the sacrificial layer to form the at least two semiconductor nano-sheets suspended on the subtract; separately doping impurities into two sets of channel regions to form P-type semiconductor nano-sheet channels and N-type semiconductor nano-sheet channels, wherein a width of the P-type semiconductor nano-sheet channel is greater than that of the N-type semiconductor nano-sheet channel; forming a first gate dielectric layer on the P-type semiconductor nano-sheet channel fully surrounding the P-type semiconductor nano-sheet channels, a first gate electrode layer fully surrounding the first gate dielectric layer, and a second gate dielectric layer on the N-type semiconductor nano-sheet channels fully surrounding the N-type semiconductor nano-sheet channels, a second gate electrode layer fully surrounding the second gate dielectric layer; forming a common electrode fully surrounding the first gate electrode layer and the second gate electrode layer; forming a first source region and a first drain region, connected to two ends of the P-type semiconductor nano-sheet channel respectively, and a second source region and a second drain region, connected to two ends of the N-type semiconductor nano-sheet channel respectively.

In accordance with some embodiments, the stack structures are formed with an epitaxial deposition process, the sacrificial layer is epitaxial-grown SiGe layer and the semiconductor nano-sheets is epitaxial-grown Si layer on the sacrificial layer.

In accordance with some embodiments, the thickness of the sacrificial layer is 10-200 nm, and the thickness of the semiconductor nano-sheets is 10-100 nm.

In accordance with some embodiments, the method may further comprise forming rounded corners of the semiconductor nano-sheets with oxidation process and then wet etching process after the step of removing the sacrificial layer. And the method further comprises performing hydrogen annealing after the step of forming rounded corners of the semiconductor nano-sheets with oxidation process and then wet etching process.

In accordance with some embodiments, the first source region and the first drain region is epitaxial-grown on two ends of the P-type semiconductor nano-sheet channel, and the second source region and the second drain region is epitaxial-grown on two ends of the N-type semiconductor nano-sheet channel.

In accordance with some embodiments, the material of the first source region and the first drain region comprise P-type SiGe, the material of the second source region and the second drain region comprise N-type SiC.

In accordance with some embodiments, the method may further comprise a step of forming a shallow trench isolation structure on the substrate and a step of forming an insulation barrier layer on the substrate.

As described above, the Gate-All-Around nano-sheet complementary inverter of the present invention and the manufacturing method thereof have the following beneficial effects:

To sum up, the present invention may provide a 3-D structure with stacked silicon nano-sheets to form a gate fully surrounding the surface of a channel, a GAA, and a common gate surrounding several channels at the same time to form a denser structure. Then, with the channels which apply a quantum well layer wrapping the silicon nano-sheets, the device as a complementary invertor formed by HEMT and HHMT may carry out a better performance and capability to shrink in size. Further, the track-like cross-section profile of the channels may increase the cross-sectional area of the channel to increase the driving current and sustain electrical integrity at the same time.

Compared with current device, those provided by the present invention may be denser with higher device density, better performance, more simple structure, and lower barrier to make. Therefore, the present invention overcomes various drawbacks in the current technology.

BRIEF DESCRIPTION OF THE DRAWINGS

Various objects and advantages of the present invention will be more readily understood from the following detailed description when read in conjunction with the appended drawing, in which:

FIGS. 1a-1b show diagrams of a gate-all-around (GAA) nano-sheet complementary inverter according to an embodiment of the invention, in which FIG. 1a is a top view and FIG. 1b is a cross-section view along AA' direction indicated in FIG. 1a;

DESCRIPTION OF EMBODIMENTS OF THE INVENTION

For a more complete understanding of the present disclosure and its advantages, reference is now made to the following description taken in conjunction with the accompanying drawings, in which like reference numbers indicate like features. Persons having ordinary skill in the art will understand other varieties for implementing example embodiments, including those described herein. The drawings are not limited to specific scale and similar reference numbers are used for representing similar elements. As used in the disclosures and the appended claims, the terms "example embodiment," "exemplary embodiment," and "present embodiment" do not necessarily refer to a single embodiment, although it may, and various example embodiments may be readily combined and interchanged, without departing from the scope or spirit of the present disclosure.

It is to be understood that these embodiments and drawings are not meant as limitations of the invention but merely exemplary descriptions of the invention with regard to certain specific embodiments. Indeed, different numbers, shapes and sizes of elements may be apparent to those skilled in the art without departing from the scope of the annexed claims.

Figure 1A:
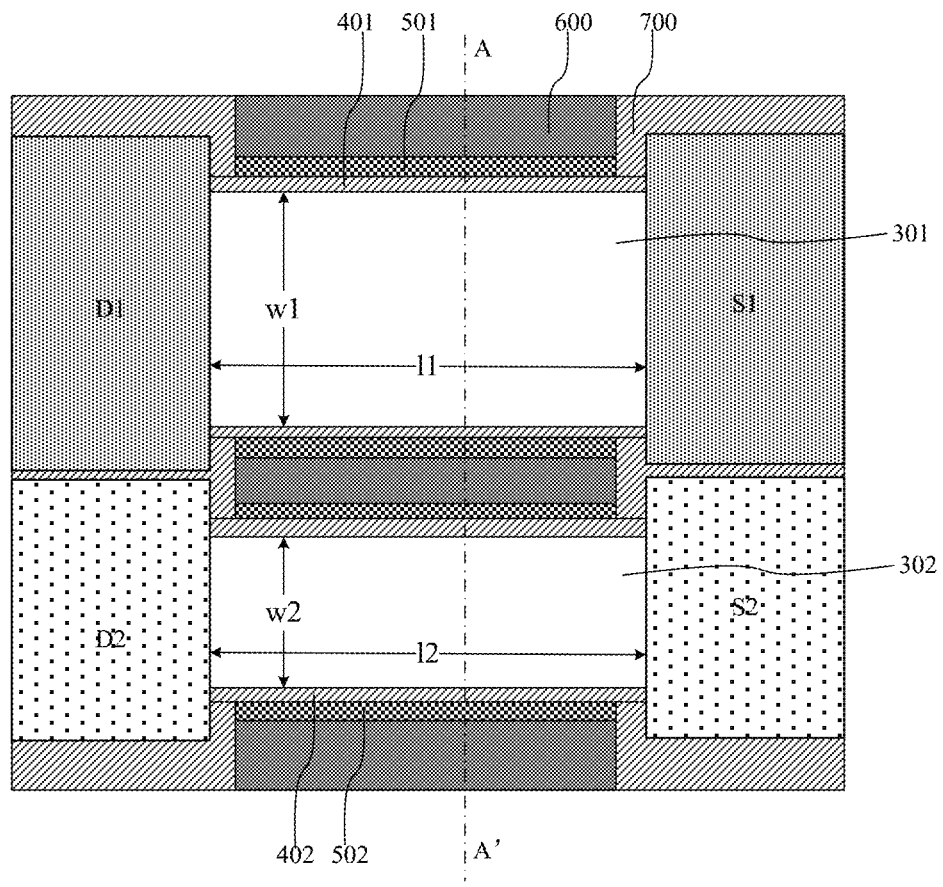
Figure 1B:
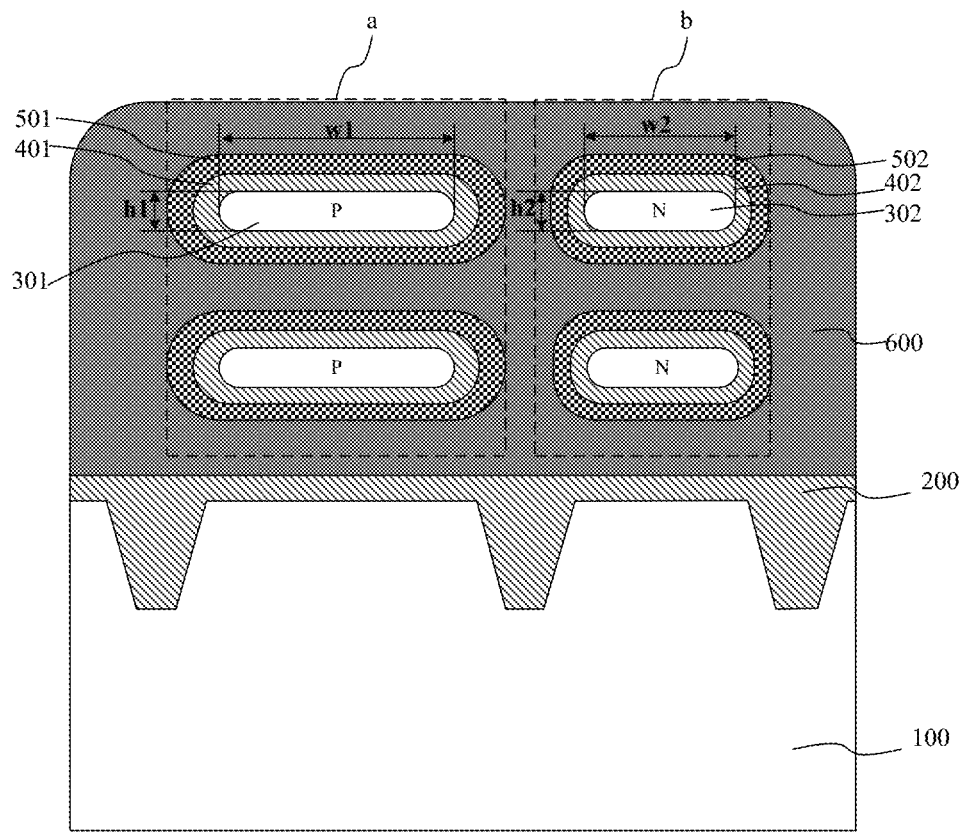

Please refer to FIGS. 1a and 1b, which show diagrams of a gate-all-around (GAA) nano-sheet complementary inverter according to an embodiment of the invention. The GAA nano-sheet complementary inverter comprises a substrate 100, a P-type field effect transistor (pFET) a, an N-type FET(nFET) b, and a common gate electrode 600, on the substrate 100. FIG. 1a is a top view and FIG. 1b is a cross-section view along AA' direction indicated in FIG. 1a.

The substrate 100 may be a typical bulk silicon substrate or other proper semiconductor substrate. On the substrate 100, an insulation barrier layer 200 is positioned to isolate the pFET a and the nFET b.

The pFET a and the nFET b both are GAA non-planar transistor. The structures are basically the same, the pFET a comprises P-type semiconductor nano-sheet channels 301 on the substrate 100, a first gate dielectric layer 401 fully surrounding the P-type semiconductor nano-sheet channels 301, a first gate electrode layer 501 fully surrounding the first gate dielectric layer 401, a first source region S1 and a first drain region D1, connected to two ends of the P-type semiconductor nano-sheet channel 301 respectively. The nFET comprises N-type semiconductor nano-sheet channels 302, a second gate dielectric layer 402 fully surrounding the N-type semiconductor nano-sheet channels 302, a second gate electrode layer 502 fully surrounding the second gate dielectric layer 402, a second source region S2 and a second drain region D2, connected to two ends of the N-type semiconductor nano-sheet channel 302 respectively.

The common gate electrode 600 may fully surround the first gate layer 501 and the second gate layer 502 to connect them together.

Wherein the P-type semiconductor nano-sheet channels 301 and the N-type semiconductor nano-sheet channels, are 302 laterally aligned. The P-type semiconductor nano-sheet channels 301 are with a width w1, and a length l1 along a horizontal direction, and a height h1 along a vertical direction, the length of the P-type semiconductor nano-sheet channels l1 define a distance between the first source region S1 and the first drain region D1. The N-type semiconductor nano-sheet channels, are 302 are with a width w2, and a length l2 along a horizontal direction, and a height h2 along a vertical direction, the length of the N-type semiconductor nano-sheet channels l2 define a distance between the second source region S2 and the second drain region D2. Also, a width w1 of the P-type semiconductor nano-sheet channel 301 is greater than that w2 of the N-type semiconductor nano-sheet channel, while their heights h1 and h2 are basically the same, in one embodiment, h1 and h2 are in the range of 10-100 nm. Specifically, Along the width w1 and w2 of the semiconductor nano-sheets 301, 302, a cross-section profile may be like a track, as shown in FIG. 1b, which comprises two semicircles at two ends and a rectangle connecting to the semicircles in the middle. Such profile may increase the cross-sectional area of the channel to increase driving current and meanwhile sustain electrical integrity of the device. Since the hole mobility of the P-type semiconductor channels 305 is generally smaller than the electron mobility of the N-type semiconductor channels 405, the cross-sectional width of each of the P-type semiconductor channels 305 designed to be wider than that of the N-type semiconductor channels 405 can effectively improve the balance of the CMOS.

Preferably, the P-type semiconductor nano-sheet channels 305 can use P type silicon nano-sheet and the N-type semiconductor nano-sheet channel 405 can use silicon nano-sheet. The source region and drain region of the pFET, that is, the first source region S1 and the first drain region D1, can use epitaxial-grown P-type SiC material, while the source region and drain region of the nFET, that is, the second source region S2 and the second drain region D2, can use epitaxial-grown N-type SiGe material. Wherein, the source region and drain region of the pFET, use epitaxial-grown P-type SiC material can produce compressive-strained pFET channel to increase the hole mobility, while of the source region and drain region of the nFET use epitaxial-grown N-type SiGe material can produce tensile-strained nFET channel to increase the electron mobility. As shown in FIG. 1a, there is a dielectric layer 700 formed between the first source region S1/the first drain region D1 and the first gate electrode layer 501/common electrode 600, and a dielectric layer 700 is also formed between the second source region S2/the second drain region D2 and the second gate electrode layer 502/common electrode 600 to serve as a spacer.

Figure 2:
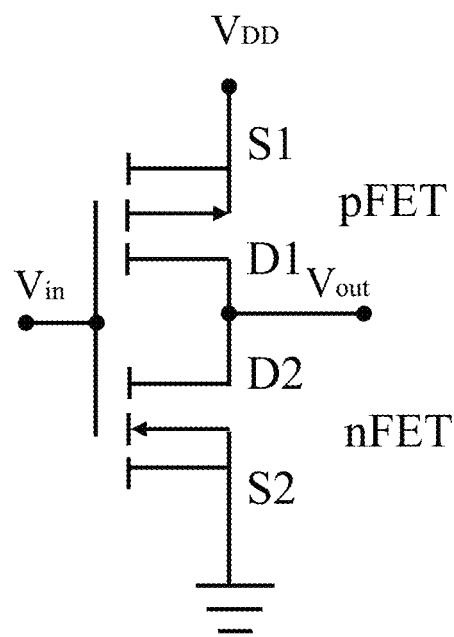
FIG. 2 shows a circuit diagram of the GAA nano-sheet complementary inverter according to an embodiment of the invention.

The GAA nano-sheet complementary inverter of the present invention may apply the circuit of complementary inverter as shown in FIG. 2. The pFET is marked as a and the nFET is marked as, the first source area S1 connects to an power source $V_{DD}$, the first drain area D1 connects to the second drain area D2 to serve as an output end $V_{out}$, the second source area S2 connects to ground and the common gate electrode 600 serve as an input end $V_{in}$.

Besides, preferably, the pFET a may comprise a plurality of P-type semiconductor nano-sheet channels arranged along the longitude direction, and the nFET b may comprise a plurality of N-type semiconductor nano-sheet channels arranged along the longitude direction to promote the performance. In the present embodiment, each transistor may correspond to upper and lower channels. However, in other embodiments, each transistor may correspond to more channels.

Here a method for making a GAA nano-sheet complementary inverter is introduced along with the drawings.

Figure 3A:
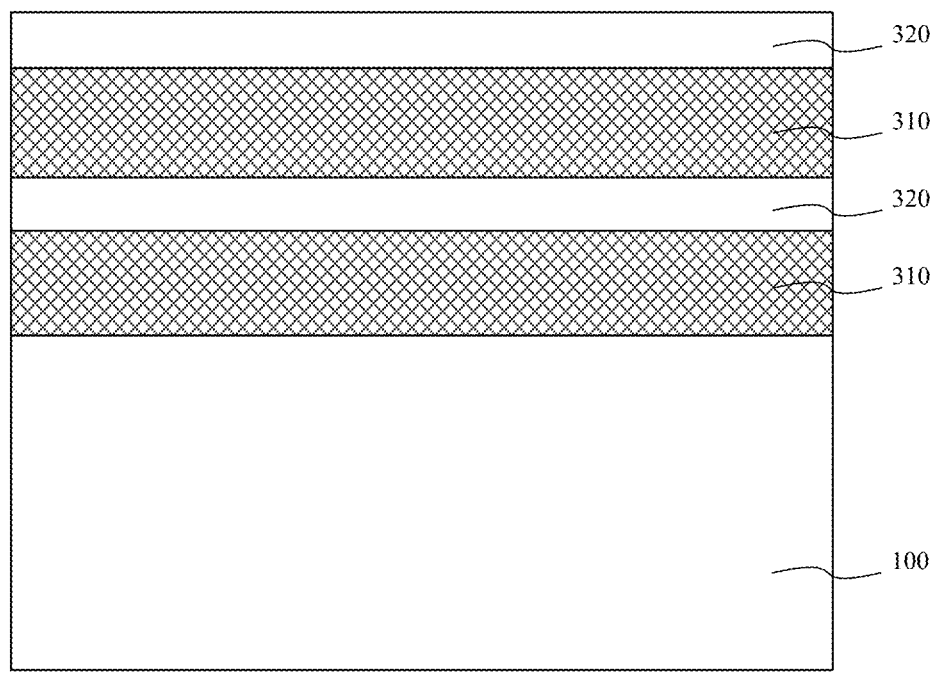
FIGS. 3a-3n show a flow chart of a method of making a GAA nano-sheet complementary inverter according to an embodiment of the invention.
Figure 3B:
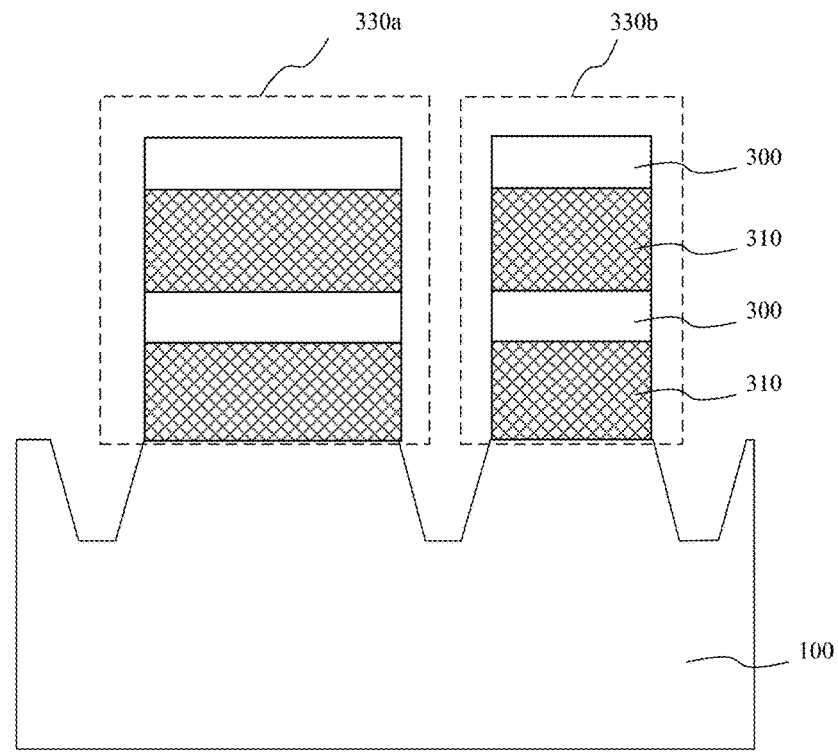
Figure 3C:
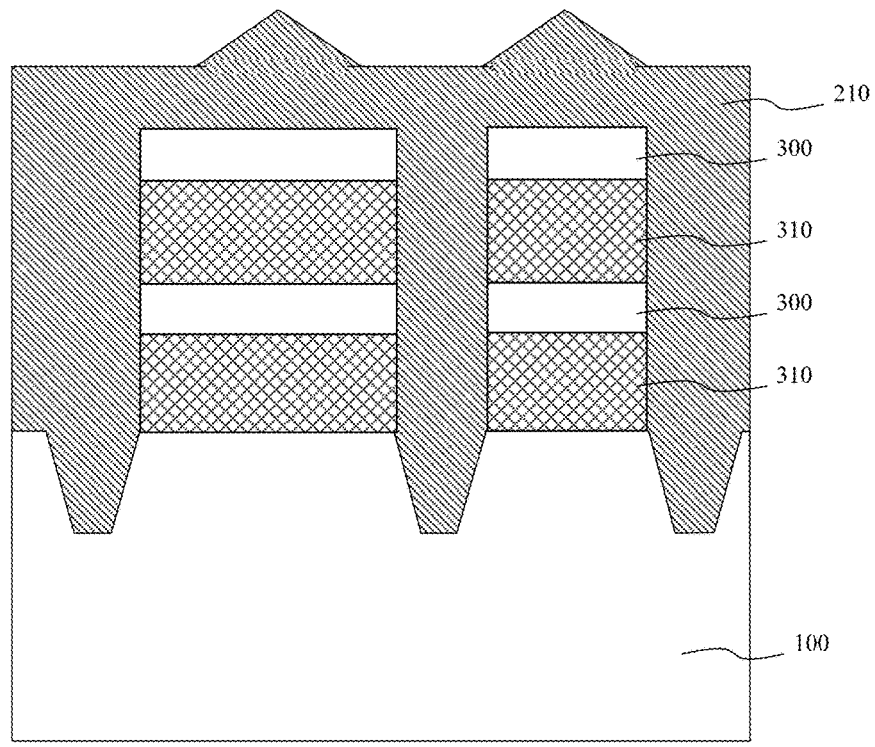
Figure 3D:
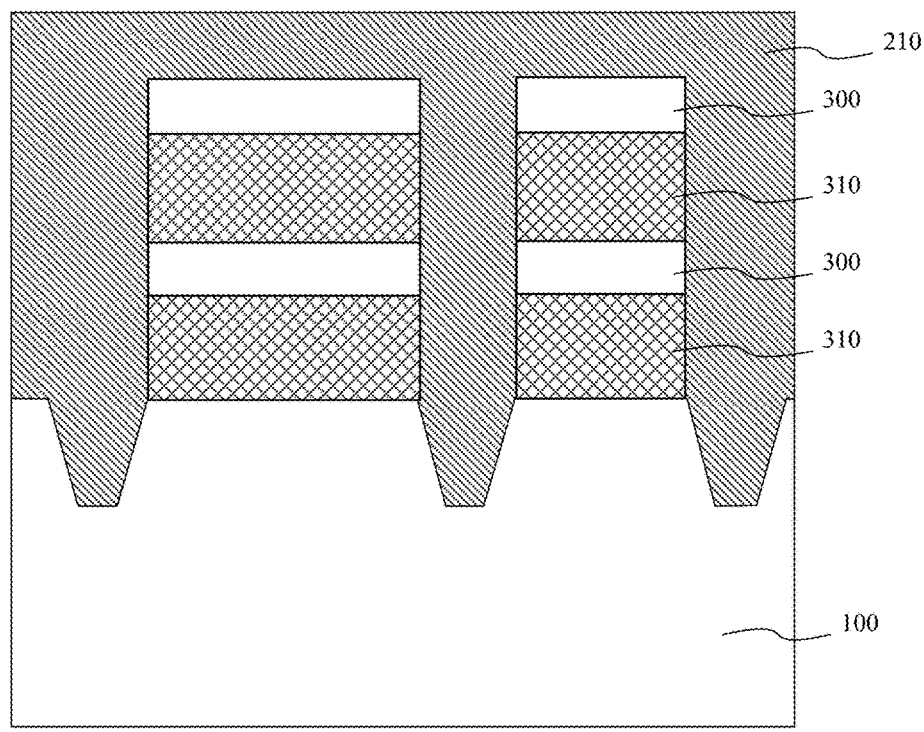
Figure 3E:
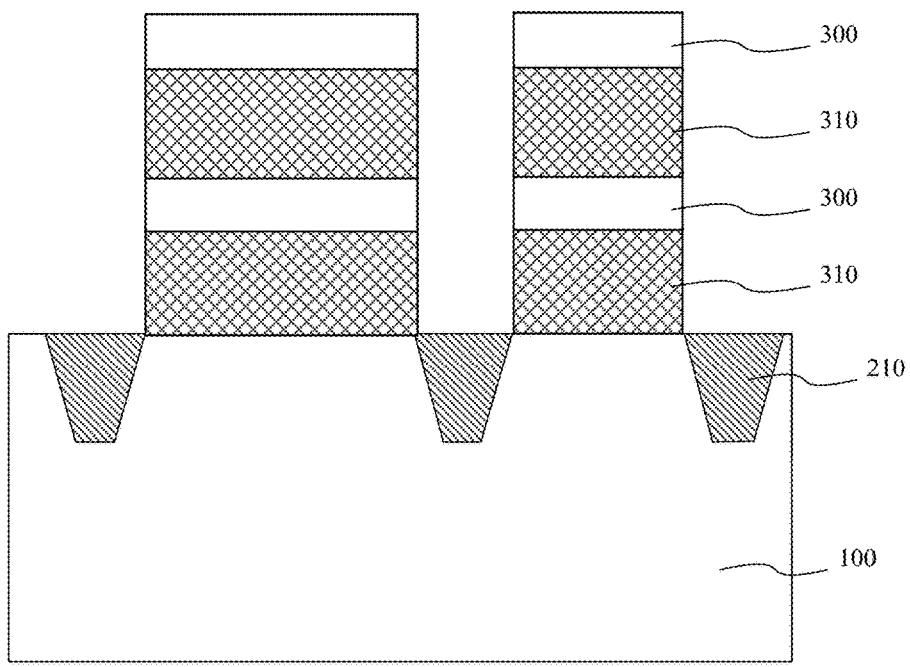
Figure 3F:
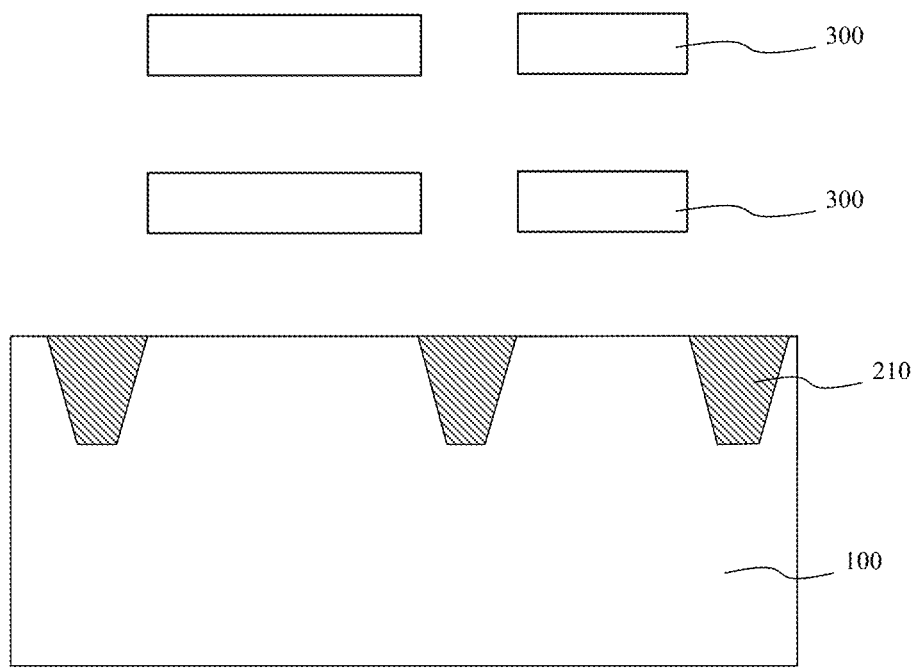
Figure 3G:
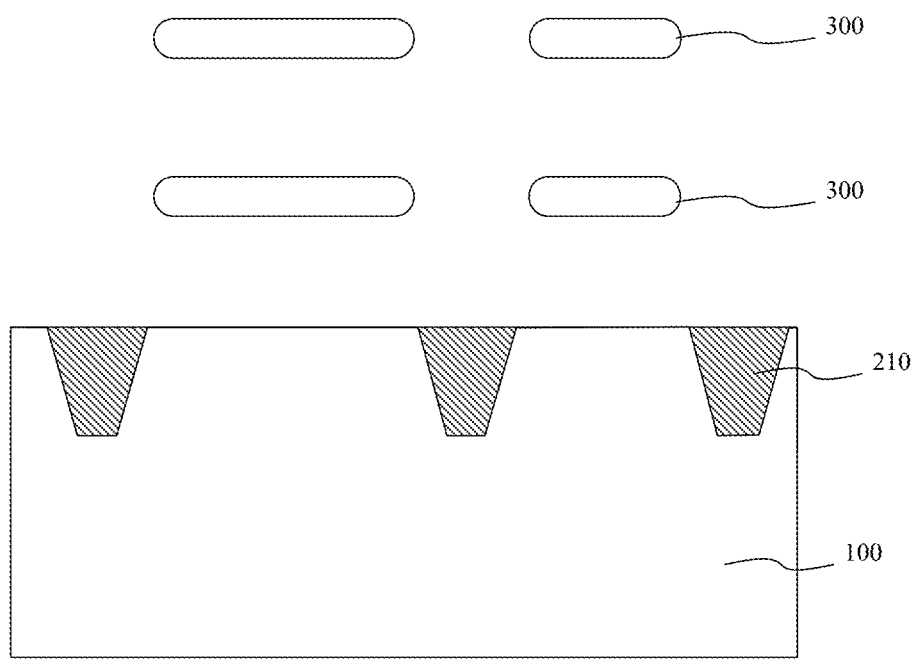
Figure 3H:
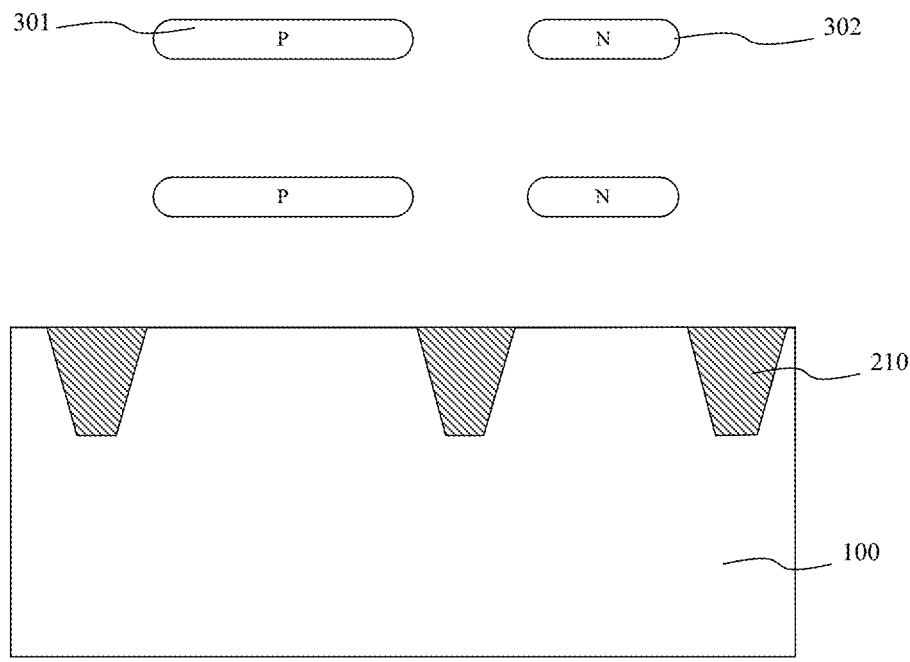
Figure 3I:
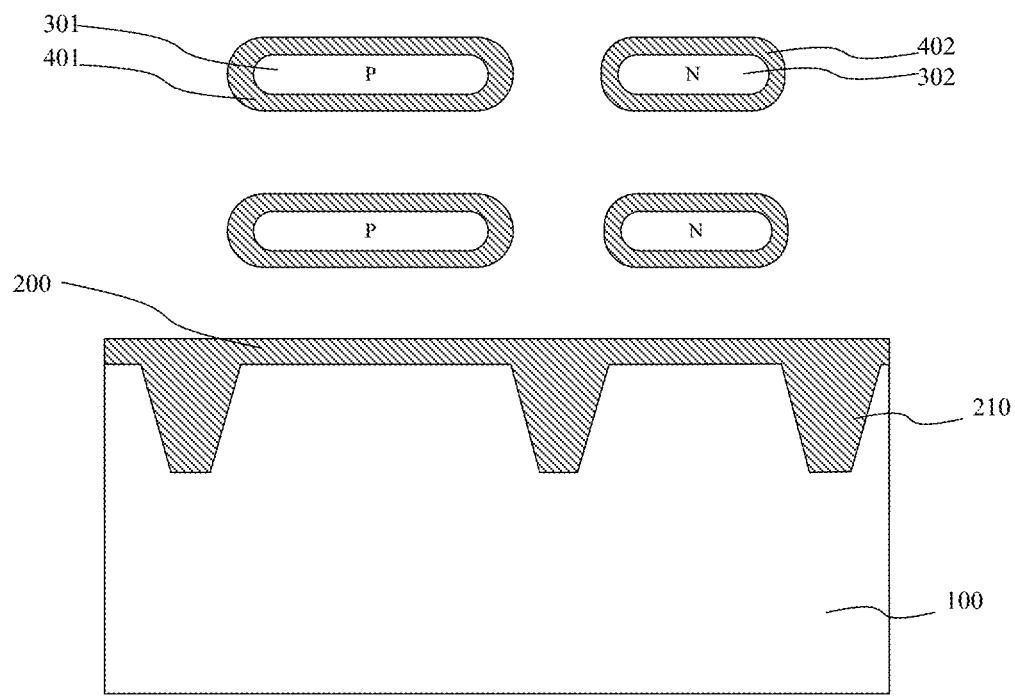
Figure 3J:
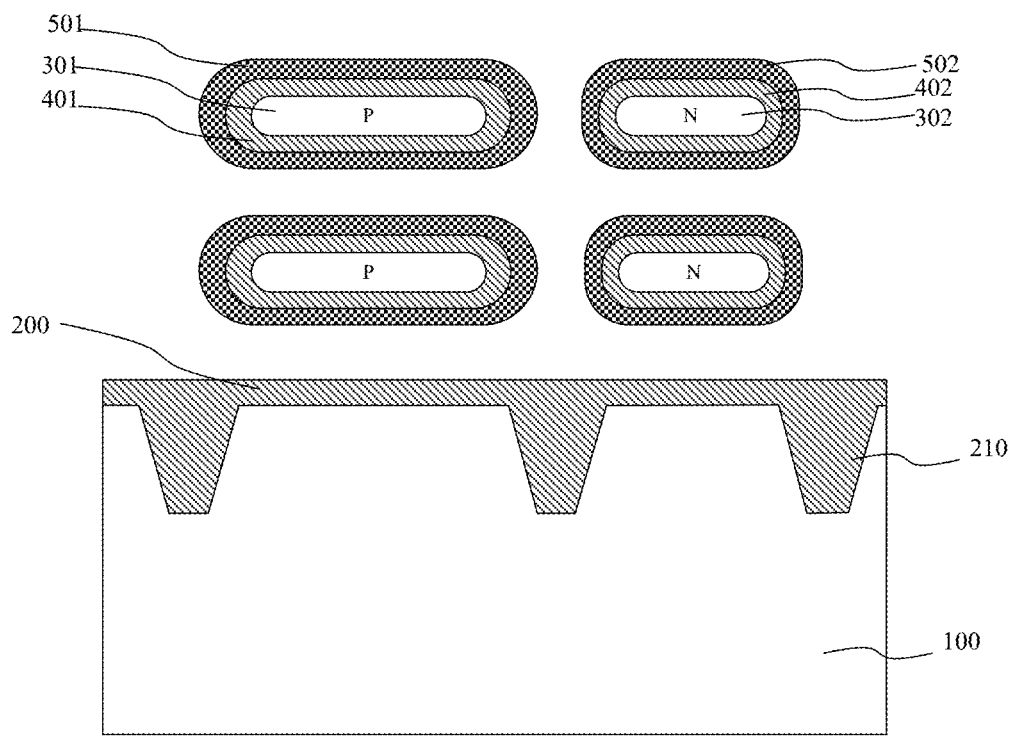
Figure 3K:
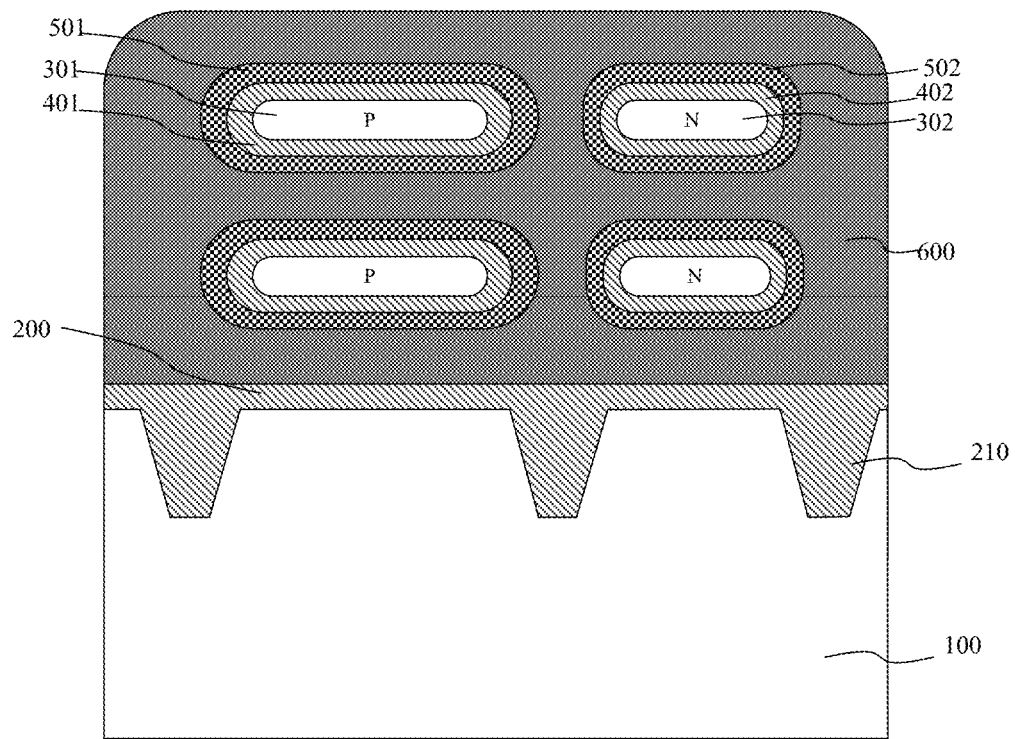
Figure 3L:
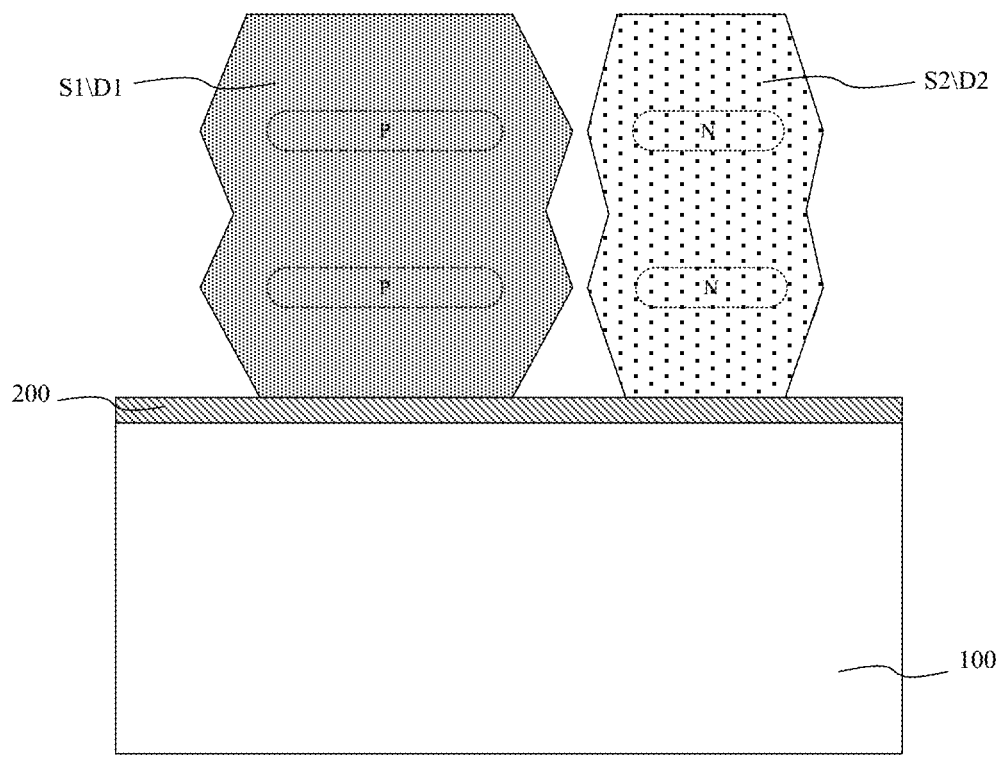
Figure 3M:
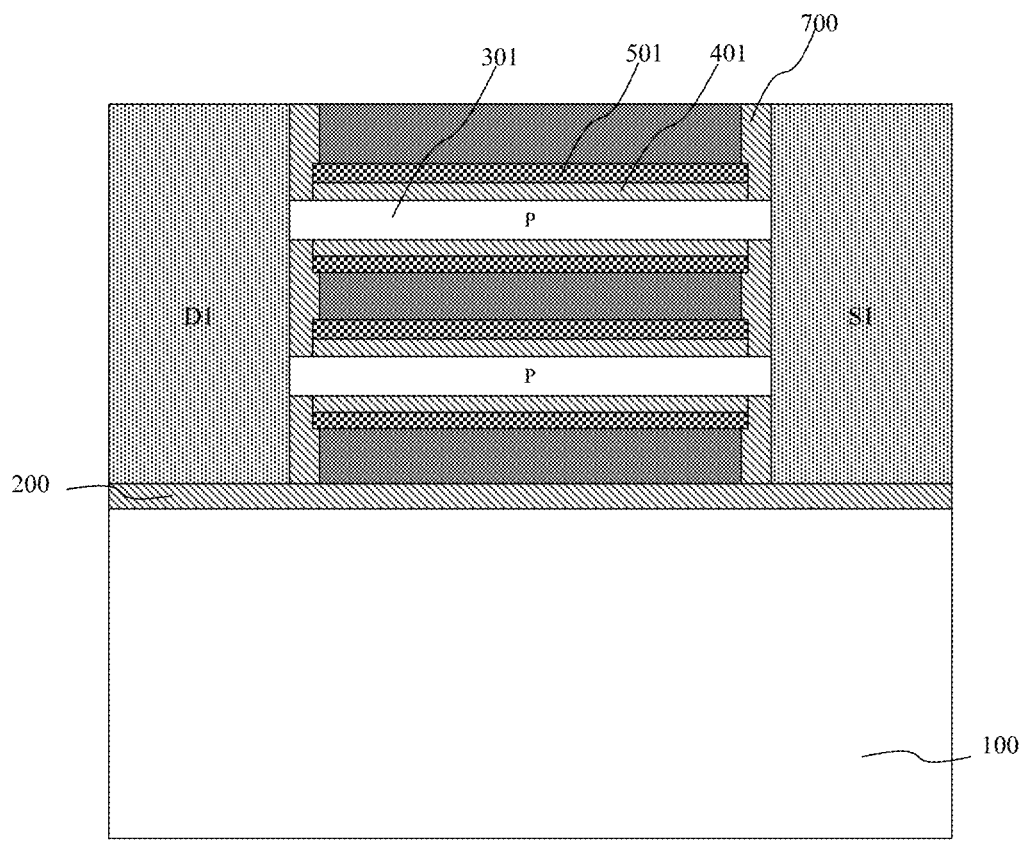
Figure 3N:
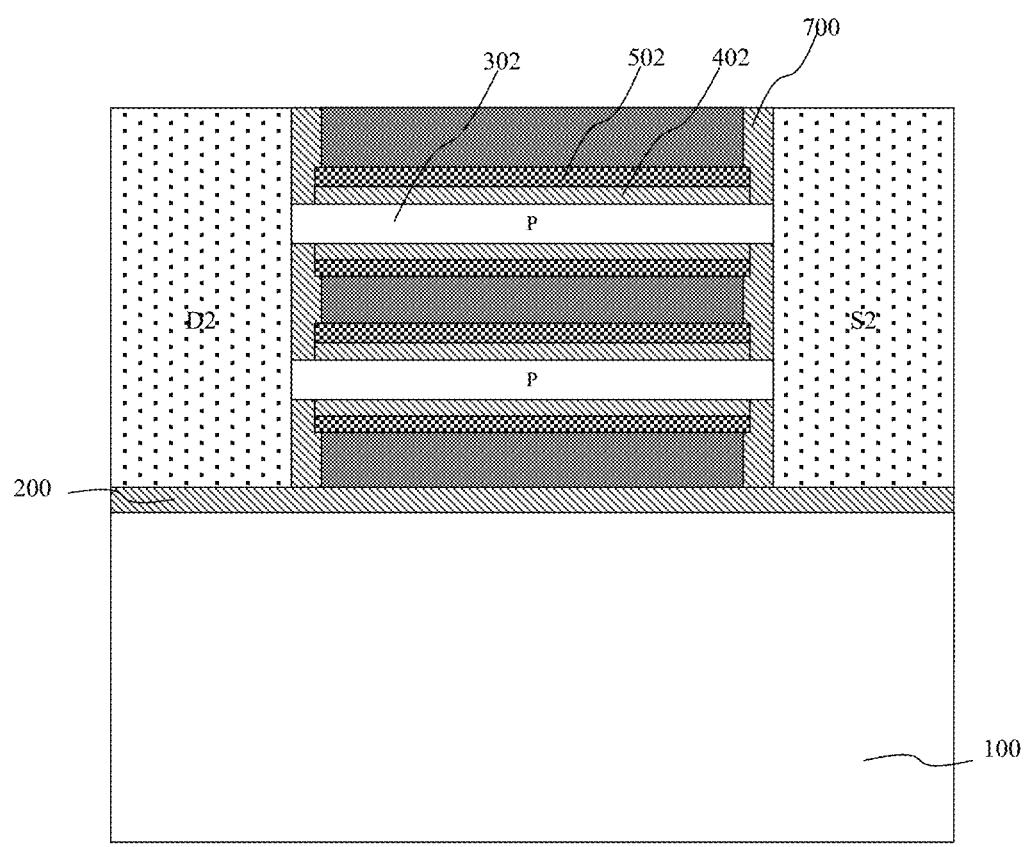

As shown in FIGS. 3a-3n, the method for making a GAA nano-sheet complementary inverter provided by the present embodiment comprises steps S1-S7.

Step S1 is providing a substrate 100. The substrate 100 may be typical bulk silicon substrate or other proper semiconductor substrate.

Step S2 is forming a stack of alternating sacrificial layer 310 and semiconductor nano-sheets 320, both of which are layered alternately, as shown in FIG. 3a.

Specifically, the stack may be formed with an epitaxial deposition process on the substrate 100. For example, the sacrificial layer 310 may be epitaxial-grown SiGe layer on the substrate 100, and then the semiconductor nano-sheets 320 may be epitaxial-grown Si layer on the sacrificial layer 310. The thickness of the sacrificial layer 310 may be in the range of 10-200 nm, and that of the semiconductor nano-sheets 320 may be in the range of 10-100 nm. In the present embodiment, two layers of sacrificial layer 310 and semiconductor nano-sheets 320 are alternatively formed in the stack. However, in other embodiments, more layers may be applied to provide more number of channels.

Step S3 is defining at least two channel areas positioned side by side, etching the stack to form two sets of semiconductor nano-sheets 300, positioned side by side, and removing the sacrificial layer 310 underneath the semiconductor nano-sheets 300 to expose rim of the semiconductor nano-sheets 300 and suspend the semiconductor nano-sheets 300 above the substrate 100.

As shown in FIG. 3b, a step of forming a shallow trench isolation (STI) structure on the substrate and meanwhile defining at least two channel areas, positioned side by side, with lithography and etching processes may be performed first. For example, the two channel areas may correspond to the first channel area 330a of the pFET a and the second channel area 330b of the nFET b. The trench extends from the surface of the stack to the inner of the substrate 100. When etching the trench, two sets of semiconductor nano-sheets 300, i.e. the silicon nano-sheets, positioned side by side, corresponding to the first channel area 330a and the second channel area 330b respectively, are formed.

Then, as shown in FIG. 3c, insulation material 210 fills up the trench, and then as shown in FIG. 3d, CMP (chemical mechanical polish) is applied to planar the surface of the structure and avoid from residual of the material on the semiconductor nano-sheets 300. Then, as shown in FIG. 3e, with lithography and etching processes, insulating material around the first channel area 330a and the second channel area 330b is removed, and the insulating material 210 filling up the substrate 100 is kept.

Then, anisotropic horizontal etching may be performed to remove the sacrificial layer 310 underneath the semiconductor nano-sheets 300. As shown in FIG. 3f, the surrounding of the semiconductor nano-sheets 300 may be exposed and suspended over the substrate 100. In the present embodiment, etchant comprising HF, $HNO_3$, $H_2O$ may be applied to remove the SiGe sacrificial layer 310.

In order to form the cross-section profile of a track, after the sacrificial layer 310 is removed, the semiconductor nano-sheets 300 may be oxidized and then wet-etched to form rounded corners. As shown in FIG. 3g, the semiconductor nano-sheets 300 may be oxidized first, and then the oxidized layer may be removed by DHF etchant to shape the semiconductor nano-sheets 300 to be like a track roughly. Then, they may be undergone hydrogen annealing between 800° C.-1200° C. for 5 mins to 8 hrs. Afterwards, the surface of the semiconductor nano-sheets 300 may be smoother and denser.

Step S4: separately doping impurities into two sets of channel regions 300 to form P-type semiconductor nano-sheet channels 301 and N-type semiconductor nano-sheet channels 302. As shown in FIG. 3h, wherein a width of the P-type semiconductor nano-sheet channel 301 is greater than that of the N-type semiconductor nano-sheet channel 302.

Step S5: Forming a first gate dielectric layer 401 fully surrounding the P-type semiconductor nano-sheets 301, and a second gate dielectric layer 402 fully surrounding the N-type semiconductor nano-sheets 302. Then, form a first gate electrode 501 fully surrounding the first gate dielectric layer 401, and a second gate dielectric layer 502 fully surrounding the second gate dielectric layer 402.

As shown in FIG. 3i, a high-K dielectric material may be deposited with a CVD or ALD process to form a first gate dielectric layer 401 and the second gate dielectric layer 402. When forming the gate dielectric layer, an insulation barrier layer 200 can be also formed on the exposed substrate 100 surface. As shown in FIG. 3j, gate material may be deposited with a CVD or ALD process to form a first gate electrode layer 501 and a second gate electrode layer 502 on the first gate dielectric layer 401 and the second gate dielectric layer 402, respectively. Specifically, a first gate electrode layer 501 is formed on the first gate dielectric layer 401, and residual gate material on the second gate dielectric layer 402 is then removed, and a second gate electrode layer 502 is formed on the second gate dielectric layer 402, and residual gate material on the first gate dielectric layer 401 is then removed. This means the first gate electrode layer 501 may be formed first and then the second gate electrode layer 502 may be formed. The gate material of the first gate electrode layer 501 may comprise TiN, TaN, TiAl, Ti or other suitable gate materials. The gate material of the second gate electrode layer 502 may comprise TiN, TaN, TiAl, Ti or other suitable gate materials.

Step S6: Forming a common gate electrode 600 which fully surrounding the first gate electrode layer 501 and the second gate electrode layer 502, and also connect them together, as shown in FIG. 3k. The material to form the common gate electrode 600 may comprise conductor such as Al, W, Cu.

Step S7: Forming a first source area S1 and a first drain area D1 (not shown) at two ends of the P-type semiconductor nano-sheet channels 301, respectively and forming a second source area S2 and a second drain area D2 (not shown) at two ends of the N-type semiconductor nano-sheet channels 302, respectively to finish the manufacturing of the pFET a and the nFET b.

Specifically, the first source region S1 and the first drain region D1 is epitaxial-grown SiGe on two ends of the P-type semiconductor nano-sheet channel 301, and the second source region S2 and the second drain region D2 is epitaxial-grown SiC on two ends of the N-type semiconductor nano-sheet channel 302. FIG. 3l is a side view after the formation of source and drain regions, while FIGS. 3m and 3n are cross section view along the length direction of the P-type semiconductor nano-sheet channel 301, and the N-type semiconductor nano-sheet channel 302, respectively. There is a dielectric layer 700 formed between the first source region D1/the first drain region S1 and the first gate electrode layer 501/common electrode 600, and a dielectric layer 700 also formed between the second source region S2/the second drain region D2 and the second gate electrode layer 502/common electrode 600.

Finally, as shown in FIG. 2, forming the complementary invertor a complete invertor, comprising forming wires of source and drain. Because the channels of pFET and nFET are positioned side by side laterally, it may be easier to connect and forming wires of the source and drain of them and form a denser component to integration.

To sum up, the present invention may provide a 3-D structure with stacked silicon nano-sheets to form a gate fully surrounding the surface of a channel, a GAA, and a common gate surrounding several channels at the same time to form a denser structure. Then, with the channels which apply a quantum well layer wrapping the silicon nano-sheets, the device as a complementary invertor formed by HEMT and HHMT may carry out a better performance and capability to shrink in size. Further, the track-like cross-section profile of the channels may increase the cross-sectional area of the channel to increase the driving current and sustain electrical integrity at the same time.

Compared with current device, those provided by the present invention may be denser with higher device density, better performance, more simple structure, and lower barrier to make. Therefore, the present invention overcomes various drawbacks in the current technology.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically, a description of a technology in the "Background" is not to be construed as an admission that technology is prior art to any invention(s) in this disclosure. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings herein.

What is claimed is:

1. A Gate-All-Around nano-sheet complementary inverter, comprising:
   a substrate;
   P-type semiconductor transistors and N-type semiconductor transistors on the substrate, wherein the P-type semiconductor transistors comprise P-type semiconductor nano-sheet channels, a first gate dielectric layer fully surrounding the P-type semiconductor nano-sheet channels, a first gate electrode layer fully surrounding the first gate dielectric layer, a first source region and a first drain region, connected to two ends of the P-type semiconductor nano-sheet channel respectively, the N-type semiconductor transistors comprise N-type semiconductor nano-sheet channels, a second gate dielectric layer fully surrounding the N-type semiconductor nano-sheet channels, a second gate electrode layer fully surrounding the second gate dielectric layer, a second source region and a second drain region, connected to two ends of the N-type semiconductor nano-sheet channel respectively;

a common electrode connecting the first gate electrode layer and the second gate electrode layer, and the common electrode fully surrounding the first gate electrode layer and the second gate electrode layer;

wherein the P-type semiconductor nano-sheet channels and the N-type semiconductor nano-sheet channels are laterally aligned, and with a width, and a length along a horizontal direction, and a height along a vertical direction, the length of the P-type semiconductor nano-sheet channels define a distance between the first source region and the first drain region, the length of the N-type semiconductor nano-sheet channels define a distance between the second source region and the second drain region, the width of the P-type semiconductor nano-sheet channel is greater than that of the N-type semiconductor nano-sheet channel.

2. The Gate-All-Around nano-sheet complementary inverter according to claim 1, wherein the first source region connects to the power, the first drain and the second drain regions connect together as output, the second source connects to the ground, and the common electrode used as an input.

3. The Gate-All-Around nano-sheet complementary inverter according to claim 1, wherein a cross-sectional shape along the width direction of the P-type semiconductor nano-sheet channel and the N-type semiconductor nano-sheet channel are a racetrack shape, the racetrack shape is formed by half circles of left hand side and right hand side and connected with a rectangle in the middle.

4. The Gate-All-Around nano-sheet complementary inverter according to claim 1, wherein the P-type semiconductor nano-sheet channel is silicon nano-sheet and the N-type semiconductor nano-sheet channel is silicon nano-sheet.

5. The Gate-All-Around nano-sheet complementary inverter according to claim 1, wherein the P-type semiconductor transistors comprise a plurality of P-type semiconductor nano-sheet channels along the longitude direction, and the N-type semiconductor transistors comprise a plurality of N-type semiconductor nano-sheet channels along the longitude direction.

6. The Gate-All-Around nano-sheet complementary inverter according to claim 1, wherein the material of the first source region and the first drain region comprise P-type SiGe, the material of the second source region and the second drain region comprise N-type SiC.

7. The Gate-All-Around nano-sheet complementary inverter according to claim 1, wherein a dielectric layer is formed between the first source region/the first drain region and the first gate electrode layer/common electrode, and a dielectric layer is also formed between the second source region/the second drain region and the second gate electrode layer/common electrode.

8. The Gate-All-Around nano-sheet complementary inverter according to claim 1, wherein an insulation barrier layer formed below the P-type semiconductor transistors and the N-type semiconductor transistors to isolate the substrate.

9. A method of making a Gate-All-Around nano-sheet complementary inverter, comprising steps of:

providing a substrate;

alternatively forming sacrificial layer and semiconductor nano-sheet layer on the substrate to form stack structures;

defining at least two channel regions with different widths, and etching stack structures to obtain at least two semiconductor nano-sheets with different widths, correspond to at least two channel regions with different widths, removing the sacrificial layer to form the at least two semiconductor nano-sheets suspended on the substrate;

separately doping impurities into two sets of channel regions to form P-type semiconductor nano-sheet channels and N-type semiconductor nano-sheet channels, wherein a width of the P-type semiconductor nano-sheet channel is greater than that of the N-type semiconductor nano-sheet channel;

forming a first gate dielectric layer on the P-type semiconductor nano-sheet channel fully surrounding the P-type semiconductor nano-sheet channels, a first gate electrode layer fully surrounding the first gate dielectric layer, and a second gate dielectric layer on the N-type semiconductor nano-sheet channels fully surrounding the N-type semiconductor nano-sheet channels, a second gate electrode layer fully surrounding the second gate dielectric layer;

forming a common electrode fully surrounding the first gate electrode layer and the second gate electrode layer;

forming a first source region and a first drain region, connected to two ends of the P-type semiconductor nano-sheet channel respectively, and a second source region and a second drain region, connected to two ends of the N-type semiconductor nano-sheet channel respectively.

10. The method according to claim 9, wherein the stack structures are formed with an epitaxial deposition process, the sacrificial layer is epitaxial-grown SiGe layer and the semiconductor nano-sheets is epitaxial-grown Si layer on the sacrificial layer.

11. The method according to claim 9, wherein the thickness of the sacrificial layer is 10-200 nm, and the thickness of the semiconductor nano-sheets is 10-100 nm.

12. The method according to claim 9, further comprising forming rounded corners of the semiconductor nano-sheets with oxidation process and then wet etching process after the step of removing the sacrificial layer.

13. The method according to claim 12, further comprising performing hydrogen annealing after the step of forming rounded corners of the semiconductor nano-sheets with oxidation process and then wet etching process.

14. The method according to claim 9, wherein the first source region and the first drain region is epitaxial-grown on two ends of the P-type semiconductor nano-sheet channel, and the second source region and the second drain region is epitaxial-grown on two ends of the N-type semiconductor nano-sheet channel.

15. The method according to claim 9, wherein the material of the first source region and the first drain region comprise P-type SiGe, the material of the second source region and the second drain region comprise N-type SiC.

16. The method according to claim 9, further comprising a step of forming a shallow trench isolation structure on the substrate and a step of forming an insulation barrier layer on the substrate.

* * * * *